United States Patent [19]

Abrams

[11]  4,419,279

[45]  Dec. 6, 1983

[54] CONDUCTIVE PASTE, ELECTROCONDUCTIVE BODY AND FABRICATION OF SAME

[75] Inventor: John C. Abrams, Tappan, N.Y.

[73] Assignee: Potters Industries, Inc., Hasbrouck Heights, N.J.

[21] Appl. No.: 187,428

[22] Filed: Sep. 15, 1980

[51] Int. Cl.$^3$ .............................................. H01B 1/02
[52] U.S. Cl. ................... 252/514; 106/1.14; 106/1.18; 106/1.19; 252/511; 252/512; 252/518; 428/403; 428/404; 428/406; 523/442; 523/444; 524/439
[58] Field of Search ............... 252/514, 512, 518, 511; 428/403, 404, 406; 260/37 EP, 37 M, 42.14; 106/1.18, 1.19, 1.14; 524/439; 523/442, 444

[56] References Cited

U.S. PATENT DOCUMENTS

| | | | |
|---|---|---|---|
| 2,280,135 | 4/1942 | Ward . | |
| 2,313,379 | 3/1943 | Wood | 200/301 |
| 2,506,728 | 5/1950 | McGrath | 220/67 |
| 2,771,380 | 11/1956 | Coleman | 427/125 |
| 3,030,237 | 4/1962 | Price | 428/328 |
| 3,083,169 | 3/1963 | Ueda | 252/511 |
| 3,099,578 | 7/1963 | Hunter | 428/323 |
| 3,119,717 | 1/1964 | Veres . | |
| 3,202,488 | 8/1965 | Ehrreich et al. | 428/570 |
| 3,407,081 | 10/1968 | Ballard | 106/1 |
| 3,583,930 | 6/1971 | Ehrreich et al. | 252/514 |
| 3,592,781 | 7/1971 | Wirtz . | |
| 3,619,287 | 11/1971 | Stankavich . | |
| 3,635,824 | 1/1972 | Brandes et al. . | |
| 3,718,608 | 2/1973 | Mason et al. . | |
| 3,741,780 | 6/1973 | Hoffman . | |
| 3,846,345 | 11/1974 | Mason et al. . | |
| 3,859,128 | 1/1975 | Burks et al. . | |
| 3,891,450 | 6/1975 | Trease | 252/514 |
| 3,900,634 | 8/1975 | Plumal et al. | 252/514 |
| 3,932,311 | 1/1976 | Caldwell et al. | 252/514 |
| 3,957,694 | 5/1976 | Bolon | 252/514 |
| 3,968,056 | 7/1976 | Bolon et al. | 252/514 |
| 3,988,651 | 10/1976 | Hertz . | |
| 3,992,212 | 11/1976 | Youtsey et al. | 252/514 |
| 4,001,146 | 1/1977 | Horowitz | 252/514 |
| 4,011,087 | 3/1977 | Shoit | 252/514 |
| 4,075,681 | 2/1978 | Popowich | 252/514 |
| 4,088,801 | 5/1978 | Bolon | 252/514 |
| 4,090,009 | 5/1978 | Horowitz | 252/514 |
| 4,289,534 | 9/1981 | Deffeyes et al. | 252/514 |
| 4,319,920 | 3/1982 | Ehrreich | 75/0.5 A |

*Primary Examiner*—Ronald W. Griffin
*Attorney, Agent, or Firm*—Lee C. Robinson, Jr.

[57] ABSTRACT

A conductive paste and an electroconductive body fabricated from the paste, in which the paste comprises inorganic non-metallic particles coated with silver, silver particles and an organic binder, or inorganic non-metallic particles coated with silver, silver particles, particles of glassy material and an organic vehicle. An electroconductive body comprises silver particles, and inorganic non-metallic particles coated with silver, both embedded in a matrix of organic material or of glassy material. The silver particles and silver-coated inorganic non-metallic particles are in effective contacting relationship within the matrix. Also disclosed are a silver-coated glass bead, for incorporation in paste and an electroconductive body, and methods for fabricating an electroconductive body. The electroconductive bodies are useful, for example, as termination elements for capacitors, and as internal conductive elements in capacitors of the type used in thick-film technology applications.

16 Claims, 4 Drawing Figures

CONDUCTIVE PASTE, ELECTROCONDUCTIVE BODY AND FABRICATION OF SAME

The present invention relates to conductive paste and to electroconductive bodies fabricated from such paste, to the making of these electroconductive bodies, and to glass beads having a conductive coating and suitable for making conductive paste and electroconductive bodies.

BACKGROUND OF THE INVENTION

Prior to this invention, conductive paste has been fabricated from silver particles, an inorganic bonding component, and an organic binding component. Typically, such a paste contains, by weight, 60 to 70% silver, 5 to 10% glass frit and 20 to 35% of a mixture of various solvents, plasticizers and resins. This paste has been applied to a substrate, for example, a ceramic capacitor, and the substrate and paste fired to form a component comprising the substrate and a fired-on electroconductive body which provided an electrically conductive connection. Frequently, these components have been coated with solder for ready integration into a circuit at a later date.

The foregoing prior paste compositions and electroconductive bodies are, in some applications, unsatisfactory because, among other reasons, after contact with the solder some of the silver in the electroconductive body migrates or leaches out of the body into the solder. This phenomenon is known in the art as "de-wetting" and often causes a significant decrease in the conductivity of the electroconductive body, as well as impairing its adhesion to the substrate surface.

Another disadvantage of these precursor paste compositions and electroconductive bodies is that fabrication of the electroconductive body must be performed by heating the paste at high temperatures which may damage the substrate to which a paste has been applied.

Attempts have been made to find satisfactory substitutes for the above-mentioned pastes and electroconductive bodies. It has been suggested that a conductive paste may be fired to produce an electroconductive body containing micron-sized glass spheres coated with a noble metal, such as palladium or platinum, or an alloy, for example of palladium, gold and silver, embedded in a matrix of glassy dielectric material having a fusion temperature lower than the softening temperature of the glass spheres. An electroconductive body consisting of particles of alumina coated by palladium, particles of alumina coated by palladium oxide and particles of silver embedded in a glassy matrix has also be suggested. Although electroconductive bodies of this character may be said to exhibit a somewhat increased resistance to de-wetting, the use of metals such as palladium and gold entails substantial expense in the production of the electroconductive body, and its precursor conductive paste. Also, disadvantages attendant to fabrication at high firing temperatures are not avoided with these substitutes.

It has also been suggested that a conductive paste comprising an organic resin binder and a particulated electrically conductive metal-containing material, for example silver-coated glass spheres may be treated to form a conductive coating. Other electrically conductive metals are also suggested. However, an electroconductive body with better electrical and other properties, at comparable or lesser expense, would be advantageous.

SUMMARY

One general object of this invention is to provide a new and improved paste or electroconductive body.

More specifically, it is an object of this invention to provide a conductive paste and an electroconductive body comprising relatively inexpensive materials.

It is also an object of this invention to provide a conductive paste which has a consistency appropriate for screening on or other application to a substrate.

It is another object of this invention to provide conductive paste which is formable into an electroconductive body at conditions not destructive to an attached substrate.

It is yet another object of this invention to provide an electroconductive body which is durable and exhibits acceptable conductivity for long periods of time during storage and operation.

It is still another object of this invention to provide an electroconductive body which, when attached to a substrate, exhibits acceptable adhesion to such substrate for long periods of time in storage and operation.

It is a further object of this invention to provide an electroconductive body the performance of which is not impaired by de-wetting when the body is in contact with solder.

It is a still further object of this invention to provide a method for producing the foregoing electroconductive body.

It is also an object of this invention to provide a glass bead coated with silver which is suited to the production of the foregoing conductive paste and electroconductive body.

In accordance with a feature of the present invention, a conductive paste comprises inorganic non-metallic particles coated with silver, silver particles and an organic binder formable into a matrix. The silver-coated inorganic non-metallic particles and silver particles are in the organic binder thereby forming the paste. The paste is suitable for application to a substrate, to form an electroconductive body on the substrate.

In accordance with another feature of the present invention, a conductive paste comprises inorganic non-metallic particles coated with silver, silver particles, particles of a glassy material and an organic vehicle. The silver-coated inorganic non-metallic particles, silver particles and particles of glassy material are in the organic vehicle, thereby forming the paste. This paste is also suitable for application to a substrate, to form an electroconductive body on the substrate.

In accordance with another feature of the invention, in several particularly advantageous embodiments, an electroconductive body comprises silver particles, and inorganic non-metallic particles coated with silver, both embedded in a matrix of organic material. The silver particles and silver-coated inorganic non-metallic particles are in effective contacting relationship within said matrix.

In accordance with a further feature of the invention, in several particularly advantageous embodiments, an electroconductive body comprises silver particles, and inorganic non-metallic particles coated with silver, both embedded in a matrix of glassy material. The silver particles and silver-coated inorganic non-metallic particles are in effective contacting relationship within said matrix.

In another aspect, the present invention relates to a method of making an electroconductive body, which comprises combining, to form a paste, inorganic non-metallic particles coated with silver, silver particles and an organic binder formable into a matrix, and subjecting the paste to conditions sufficient to form the organic binder into a matrix in which the silver particles and silver-coated inorganic non-metallic particles are embedded.

In a further aspect, the present invention relates to a method of making an electroconductive body, which comprises combining inorganic non-metallic particles coated with silver, silver particles, particles of glassy material and an organic vehicle to form a paste, heating the paste up to a temperature sufficiently high, and for a time sufficiently long, to fuse the particles of glassy material without deforming the silver-coated inorganic non-metallic particles, and cooling the product.

A further aspect of the present invention relates to an article of manufacture useful in practicing the invention. This article comprises a glass bead which is coated on substantially its entire surface with silver, the silver constituting at least 25% by weight of the article.

Conductive paste of this invention is useful as an intermediate in the manufacture of an electroconductive body, and more specifically as a vehicle by which the components of an electroconductive body are conveniently applied to substrates, such as capacitors, dielectric components, and the like. Electroconductive bodies of this invention are, in turn, useful to provide an electrically conductive connection or film on a substrate. Thus, the electroconductive bodies find application as termination elements for ceramic capacitors, such as those of the multi-layer variety. Such electroconductive bodies may also be useful as internal conductive elements employed in combination with non-conductive elements in, for example, a multi-layer capacitor or a capacitor of the type employed in thick-film technology applications. The silver-coated glass bead of this invention is useful as a component of conductive paste and electroconductive bodies of this invention, contributing to the favorable properties thereof and, generally, decreasing production cost.

The present invention affords the advantages of providing conductive paste which comprises relatively inexpensive, easily obtainable materials and which is well-suited for conversion to an electroconductive body in a variety of applications. The electroconductive bodies, themselves, are additionally advantageous because of their desirable performance characteristics, particularly conductivity and ability to adhere to a substrate. In some especially advantageous embodiments of the invention the performance characteristics of the electroconductive bodies are not appreciably impaired by de-wetting upon contact with solder, which is typically applied to a component containing such electroconductive body to facilitate its integration into a circuit. A further advantage of the present invention is that the silver-coated glass bead containing at least 25% by weight silver provides a convenient, relatively low-cost starting material for making an electroconductive body and precursor conductive paste.

The present invention, as well as further objects and features thereof, will be more fully understood from the following description of certain preferred embodiments, when read with reference to the accompanying drawings.

It will be understood that the views shown in the drawings are not to scale, but that certain aspects, such as amount of organic component, amount of matrix, distances between particles and the like, have been emphasized for purposes of clarity.

DESCRIPTION OF PREFERRED EMBODIMENTS

Figure 1:
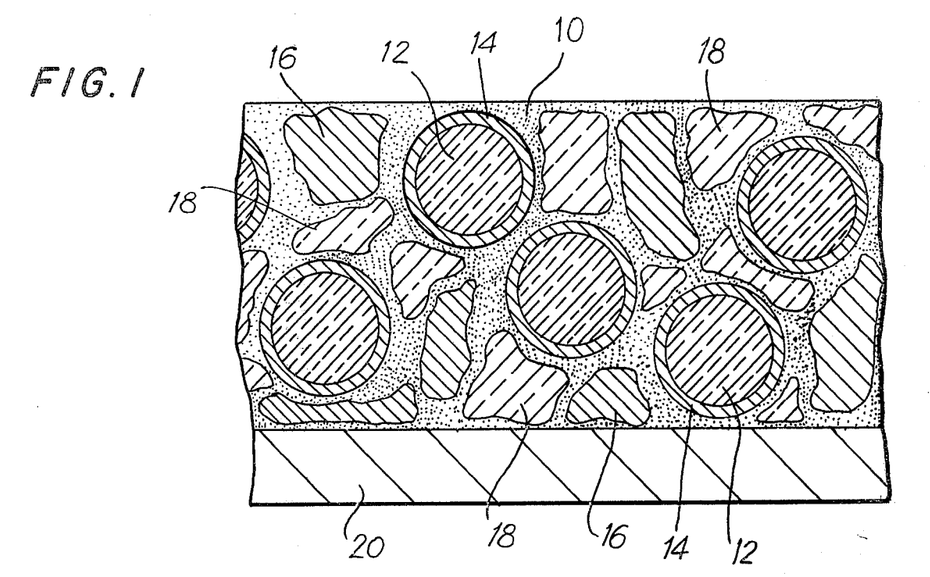
FIG. 1 is an enlarged fragmentary sectional view of conductive paste in accordance with the invention.

Referring to FIG. 1 of the drawing, there is shown conductive paste comprising an organic vehicle 10, illustratively containing polyvinyl alcohol, in which are suspended glass beads 12 having a silver coating 14, silver particles in the form of flakes 16 and particles 18 of a heat-fusible glassy material. A silver coating 14 on a glass bead 12 constitutes, illustratively, 8 to 12% by weight of the bead and coating.

This silver coating on a glass bead serves also to illustrate a silver-coated glass bead containing at least 25%, say 45%, by weight silver. As typical, the conductive paste is deposited on an appropriate substrate 20.

Figure 2:
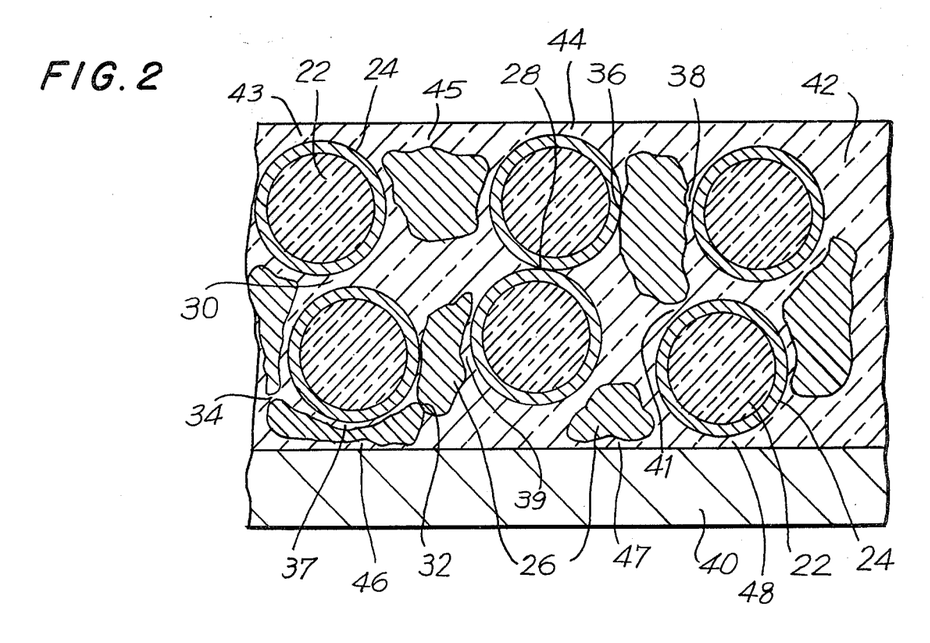
FIG. 2 is an enlarged fragmentary sectional view of an electroconductive body in accordance with the invention.

In FIG. 2, there is shown an electroconductive body comprising a matrix of a glassy material 42, in which are embedded glass beads 22, having a silver coating 24, and silver particles in the form of flakes 26. Again, as typical, the electroconductive body is deposited on and adheres to a substrate 40. A silver coating 24 on a glass bead 22 constitutes, illustratively, 8 to 12% by weight of the bead and coating. Adjacent silver-coated glass beads are in intersurface contact with one another at location 28, or are close enough together, at location 30, so that electrons can pass freely between them. Similarly, adjacent silver flakes are in intersurface contact at location 32, or close enough together, at location 34, so that electrons can pass freely between them. Also, an adjacent silver-coated glass bead and silver flake are in direct intersurface contact at location 36 and, at locations 37, 38, 39, 41 are close enough together to allow free passage of electrons. Also, for instance at locations 43 and 44, silver-coated glass beads are sufficiently close to the surface of the electroconductive body to allow free passage of the electrons between the surface and the silver-coated beads. And, for example at location 45, a silver particle is sufficiently close to the surface to allow free passage of electrons between the surface and the particle. Silver particles and a silver-coated bead are sufficiently close to the substrate, at locations 46 and 47 and location 48, respectively, to allow free passage of electrons therebetween. Thus, conductive paths through the electroconductive body are established.

Figure 3:
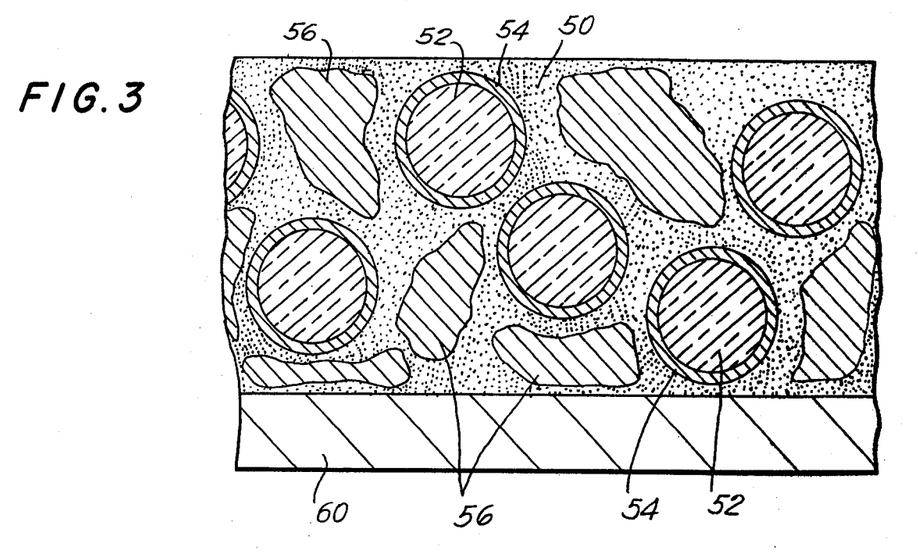
FIG. 3 is an enlarged fragmentary sectional view of an alternative embodiment of conductive paste in accordance with the invention.

Referring to FIG. 3 of the drawing, there is shown conductive paste comprising an organic binder 50, in this embodiment comprising a methacrylate polymer, in which are suspended glass beads 52 having a silver coating 54, and silver particles in the form of flakes 56. A silver coating 54 on a glass bead 52 constitutes, illustratively, 8 to 12% by weight of the bead and coating. As typical, the conductive paste is deposited on an appropriate substrate 60.

Figure 4:
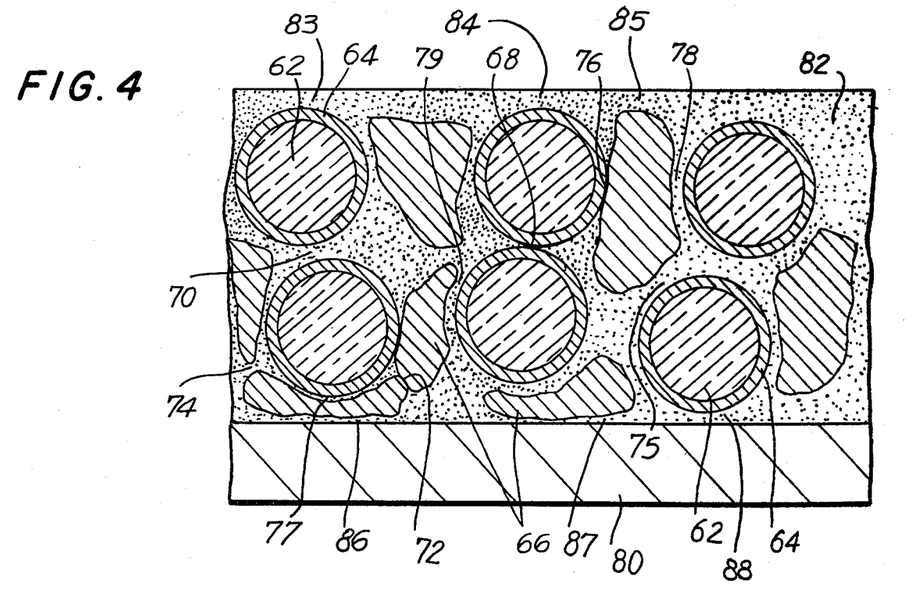
FIG. 4 is an enlarged fragmentary sectional view of an alternative embodiment of an electroconductive body in accordance with the invention.

In FIG. 4, there is shown an electroconductive body comprising a matrix of an organic material 82, in this embodiment comprising a methacrylate polymer, in which are embedded glass beads 62, having a silver coating 64, and silver particles in the form of flakes 66. Again, as typical, the electroconductive body is deposited on and adheres to a substrate 80. A silver coating 64 on a glass bead 62 constitutes illustratively, 8 to 12% by weight of the bead and coating. Adjacent silver-coated glass beads are in intersurface contact with one another at location 68, or are close enough together, at location 70, so that electrons can pass freely between them. Similarly, adjacent silver flakes are in intersurface contact at location 72, or close enough together, at location 74, so that electrons can pass freely between them. Also, an adjacent silver-coated glass bead and silver flake are in direct intersurface contact at location 76 and, at locations 75, 77, 78 and 79, are close enough together to allow free passage of electrons. Additionally, for instance at locations 83 and 84, silver-coated glass beads are sufficiently close to the surface of the electroconductive body to allow free passage of the electrons between the surface and the particle. Also, for example at location 85, a silver particle is sufficiently close to the surface to allow free passage of electrons between the surface and the particle. And silver particles and a silver-coated bead are sufficiently close to the substrate, at locations 86 and 87 and location 88, respectively, to allow free passage of electrons therebetween. Accordingly, conductive paths through the electroconductive body are established.

Silver incorporated in a paste in accordance with this invention provides a conductive component in an electroconductive body fabricated from the paste. Therefore, the amount and form of the silver in the paste are in part dependent on the properties desired for such an electroconductive body.

The coating of silver on inorganic non-metallic particles of the conductive paste is a layer which covers substantially the entire surface of each such particle. It is preferred that this layer be of uniform thickness, but thickness may vary from point to point on the particle surface without departing from the present invention. The layer of silver need only be of sufficient thickness to ensure the conductivity of an electroconductive body produced from the paste of the invention; however, thickness of the layer may be increased above this minimum, for instance, to the extent that cost considerations permit. Typically, the thickness of this layer of silver ranges up to 10% of the maximum dimension of the particle. If the inorganic non-metallic particle is a glass bead, the thickness of the silver coating is, for example, on the order of 0.1% to 10% of the diameter of the glass bead upon which it is coated.

In accordance with the invention, a preferable silver-coated inorganic non-metallic particle contains at least 25%, especially at least 40% by weight silver. It is especially preferable that the particle be a glass bead. Incorporation in the paste of such silver-coated particles maintains good conductivity of an electroconductive body made from the paste without appreciable impairment of its electrical and other properties, due to de-wetting, i.e., migration, or leaching out, of some silver from the electroconductive body. Such de-wetting often results from contact of the body with solder. It will be understood that cost advantages afforded by the employment of silver-coated inorganic non-metallic particles as opposed to employment of pure silver alone, are also attendant to this embodiment. Nonetheless, it is also within the scope of the present invention to incorporate in a paste, and electroconductive body made therefrom, silver-coated inorganic non-metallic particles containing up to 60% by weight silver, for example, of from 25% to 60% by weight silver. Silver-coated particles containing less than 25% by weight silver are also suitable in several advantageous embodiments. In a further especially preferable embodiment, the silver-coated particles contain from 4 to 16% by weight silver. Examples of the latter silver-coated particles are those containing approximately 4%, 8%, 12% and 16% by weight silver. In accordance with a preferred embodiment, the foregoing applied to glass beads.

The organic non-metallic particles, themselves, are suitably irregular in shape, or, alternatively, substantially regular in shape. Thus, these particles are, for example, granules, flakes, spheres and spheroids, such as beads. And, in a highly advantageous embodiment of this invention, these particles are glass beads which are substantially spherical in shape. The silver coating, when deposited on an inorganic non-metallic particle generally conforms to the shape of the particle, and, therefore, the shape of the silver-coated particle corresponds to the shape of the uncoated particle. Including the silver layer, these coated particles are of a size which is compatible with the attainment of the desired properties of the conductive paste and electroconductive body of this invention. That is, the silver-coated particles should be sized, for example, so that incorporation of same in the paste does not appreciably interfere with the ease of application of the paste to a substrate. Typically, the silver-coated particles are of a size from 1 to 100 microns in maximum dimension, on average.

In accordance with the foregoing, the silver-coated particles are preferably silver-coated glass beads which are substantially spherical in shape. Typically, the coated beads, including the silver layer, are of a size, on average, of up to 75 microns in diameter. Silver-coated beads of a size, on average, from 1 to 50, especially 1 to 30, microns in diameter are preferred. Further examples of appropriately sized silver-coated beads are those of a size from 1 to 5 microns in diameter on average, 5 to 10 microns in diameter on average, 10 to 15 microns in diameter on average and 10 to 25 microns in diameter on average. It will be understood that the foregoing also applies to beads or spheres of other inorganic non-metallic materials suitable for practicing of this invention.

The inorganic non-metallic particles are suitably composed of any of a wide range of materials which exhibit properties and physical characteristics consistent with attainment of the objectives of this invention. In this connection, it will be understood that "non-metallic" refers to the properties and physical characteristics of these materials, and does not preclude the presence of metal atoms or ions as long as "non-metallic" properties and physical characteristics are exhibited. Suitable materials typically display non-electroconductive properties. Accordingly, these materials are, typically, glasses, ceramic substances and naturally occurring mineral substances. The following are examples of the foregoing materials: oxides, such as bauxite, corundum, ilmenite, brookite, anatase, rutile and magnetite, and hydroxides such as brucite; sulfides, such as galena, pyrite, chalcopyrite and sphalerite; halides, such as sodium chloride, sylvite and fluorite; carbonates such as calcite, magnesite and siderite, nitrates, such as sodium nitrate, and borates, such as borax and kernite; sulfates, chromates and molybdates, examples being celestite, anhydrite and gypsum; and phosphates, such as bivianite, apatite and pyromorphite, arsenates such as erythrite, and vanadates, such as bavanadinite. Additional examples of suitable materials are conveniently classified into categories as follows: the tectosilicates, including the silica group, the feldspar group, the feldspathoid group, the zeolite group; the philosilicates, including kaolinite, talc and vermiculite and the mica group, for instance muscovite, phlogovite and biotite; the inosilicates, including the amphibole group, for instance the cummingtonite series, the pyroxene group, including the hypersthene series, for instance spodumene, and the pyroxenoid group; the cyclosilicates including beryl and tourmaline; the sorosilicate group, for instance, idocrase; the neosilicates, including the olivine series, such as magnesium iron silicate, and also including willemite; the aluminum silicate group; the garnet group; and silicates of indeterminate structure such as prehnite, chrysocolla and dumortierite. It will be understood that synthetic, as well as naturally occurring, inorganic non-metallic materials are suitable for practicing this invention. It will further be understood that a preferred shape for the silver-coated particle is spherical or spheroidal; to spheroidize a material often necessitates its heating to fairly high temperatures, and at such temperatures some of the foregoing materials, for example, some among the hydroxides, sulfides, halides, carbonates, nitrates and sulfates, may be converted to oxides.

In embodiments wherein the silver-coated particles are silver-coated glass beads, the glass beads, themselves, are typically made of what is commonly referred to as lime glass, a soda-lime silicate glass composition known in the art. However, the beads are also suitably made of titanium, or other more highly refractory glass for applications requiring special bead properties, such as thermal resistance, low alkali content and the like.

In general, the composition of the inorganic non-metallic particles selected, for example the composition of glass beads, must be such that the particles do not soften or appreciably distort in shape under processing conditions to which the paste of this invention is subjected in making an electroconductive body therefrom.

The particles of inorganic non-metallic material are produced in any suitable or common manner. As an example a suitable method for producing glass beads is to introduce crushed glass particles into a vertically disposed draft tube. The tube has a source of heat near its lower end, normally a well-distributed gas flame produced by a series of burners. As the combustion gases rise, they proceed into an expansion chamber and carry with them the glass particles which become soft, so that by surface tension the particles are shaped into spherical form. The beads are then cooled and collected. Various bead-producing systems are discussed in detail, for example, in U.S. Pat. No. 3,279,905, granted Oct. 18, 1956, to Thomas K. Wood et al., U.S. Pat. No. 3,887,914, granted Apr. 15, 1975, to Ib Von Irgens-bergh, U.S. Pat. No. 3,887,918, granted Apr. 15, 1975, to Thomas A. Cerbo, U.S. Pat. No. 3,907,537, granted Sept. 23, 1975, to Ib Von Irgens-bergh, and U.S. Pat. No. 4,046,548, granted Sept. 6, 1977, to Thomas K. Wood et al.

Silver-coating of the inorganic non-metallic particles is suitably effected by numerous means known in the art. For example, the silver-coating is applied by fluidization by dry or wet methods, by electroless plating, and the like. See, for instance, U.S. Pat. No. 3,635,824, granted Jan. 18, 1972 to Raymond G. Brandes et al.

As mentioned above, a portion of silver is incorporated in the conductive paste as silver particles. In a preferred embodiment of the invention, these silver particles comprise flakes of silver. However, it is within the scope of this invention for the silver particles to be of other shapes. Particularly in cases in which the bead coating has a relatively low silver content, such particles make up at least 5% by weight of the paste. In some embodiments, the silver particles constitute at least 10%, or even at least 25%, by weight of the paste.

The total amount of silver incorporated in the paste in the forms of silver particles and the coating on inorganic non-metallic particles is at least 10% by weight of the paste. It is preferable to incorporte enough silver in the paste to constitute at least 15%, especially at least 24%, by weight of the paste. And, it is especially preferable that the total silver content be sufficient to prevent appreciable impairment of properties, such as loss of conductivity and of adhesion to a substrate, in an electroconductive body (made from the paste) by de-wetting upon contact with solder.

In a highly advantageous embodiment of the invention, the conductive paste contains an organic binder from which the matrix of organic material of an electroconductive body made from the paste is formed. In such body, silver-coated inorganic non-metallic particles and silver particles are embedded in this matrix. The organic binder suitably comprises an inert organic material or materials formable into the matrix; the binder imparts to the paste the proper rheology, for instance, an appropriate consistency for application on a substrate by screening, painting (e.g., electrostatically or with a brush), dipping (following rack loading), continuous machine dipping, and the like. Typically, the organic binder contains one or more resins and one or more solvent to give the paste the desired consistency, but in some embodiments the binder is solventless. Examples of suitable substances are low molecular weight aliphatically unsaturated organic polymers, or a mixture of an aliphatically unsaturated organic polymer and a copolymerizable aliphatically unsaturated organic monomer, such as styrene. These substances, illustratively, have a viscosity of from about 50 to 10,000 centipoises at 25° C. Additional examples are: low molecular weight polyimides containing acrylamide unsaturation, for instance as described in U.S. Pat. No. 3,535,148, granted Oct. 20, 1970 to Abraham Ravve; low molecular weight polyester containing acrylic unsaturation, such as shown in U.S. Pat. No. 3,567,494, granted Mar. 2, 1971, to Chester W. Fitko, acrylate esters, and methacrylic esters of polyhydric alcohols, for instance as set forth in U.S. Pat. Nos. 3,551,246 and 3,551,235, granted Dec. 29, 1970 to Robert W. Bassemir et al. (see also U.S. Pat. No. 3,551, 311, granted Dec. 29, 1970 to Gerald I. Nass et al.); acrylate and methacrylate esters of silicone resins; melamine; epoxy resins; allyl ethers of polyhydric alcohols; allyl esters of polyfunctional aliphatic and aromatic acids; low molecular weight meleimido substituted aromatic compounds; cinnamic esters of polyfunctional alcohols; mixtures of two or more of the foregoing; and the like. Further examples are unsaturated polymers, such as polyesters from glycols and $\alpha, \beta$-unsaturated dicarboxylic acids, for instance maleic and fumaric acids, either with or without other dicarboxylic acids free of α,β-unsaturation, for instance phthalic, isophthalic and succinic acids, dissolved in a copolymerizable aliphatically unsaturated organic solvent, such as styrene, vinyl toluene, divinyl benzene, methyl methacrylate, or mixtures of such solvents; such systems are set forth in U.S. Pat. No. 2,673,151, granted Mar. 23, 1954 to Howard L. Gerhart and U.S. Pat. No. b 3,326,710, granted June 20, 1967 to Mary G. Brodie. Some other examples are unsaturated organosiloxanes of from 5 to 18 silicon atoms, and such siloxanes in combination with a vinylic organic monomer. Illustratively, the organic binder is an acrylic resin or an epoxy resin. Examples of suitable acrylic resins are methacrylate polymers. Examples of suitable epoxy resins are any monomeric, dimeric, oligomeric or polymeric epoxy material containing one or a plurality of epoxy functional groups, for instance bisphenol-A and diglycidyl ether. Suitable solvents are coal tar hydrocarbons, chlorinated hydrocarbons, ketones, esters, ether alcohols and ether esters. Examples are xylene, toluene, methylethyl ketone and alcohols, such as aliphatic alcohols of up to 20 carbon atoms, for instance ethanol and propanol. The binder may also contain various common additives such as catalysts and substances which sensitize the binder to radiation, for example, ultraviolet radiation. The sensitizers, for example, are suitably incorporated in small amounts, such as 0.5 to 5% by weight of the binder. Examples are ketones, such as benzophenone, acetophenone, and the like, benzoins and substituted benzoins, thiourea and aromatic disulfides; also examples are azides, thioketones and mixtures thereof. The binder is incorporated in the paste in an amount suitable to impart the above-discussed desired rheology, for instance in an amount up to 35 to 40% by weight of the paste, sometimes as low as 15%, and occasionally even down to from 5 to 10%, by weight of the paste.

In an alternative, and also advantageous, embodiment of this invention, the conductive paste contains particles of glassy material and an organic vehicle.

These particles of glassy material are suitably any finely-sized particles of vitreous material of the type termed "glass frit". Typically, these particles are of a heat-fusible glassy material. Lead monosilicate is an example of a low-fusion temperature frit material. The composition and size of particles of glassy material included in a conductive paste are selected based on the criterion that the particles must fuse to form a glassy matrix at a temperature below the temperature at which the silver-coated inorganic non-metallic particles of the conductive paste deform.

The organic vehicle incoporated in this alternative conductive paste suitably comprises any inert organic material or materials which will impart to the paste the proper rheology, for instance (and as mentioned previously), an appropriate consistency for application on a substrate by screening, painting (e.g., electrostatically or with a brush), dipping (following rack loading), continuous machine dipping, and the like. The organic vehicle is, for example, an inert organic liquid. Exemplary are aliphatic alcohols, for instance of from 2 to 20 carbon atoms such as ethanol or propanol, esters of such alcohols such as acetates and propionates, terpenes such as pine oil, α- and β-terpineol and the like. In an alternative embodiment, the organic vehicle contains not only a liquid but one or more thickeners, stabilizers, plasticizers, waxes, thermoplastic resins and/or the like. Ethyl cellulose, polyvinyl alcohol, resins, for example polymethacrylates of lower alcohol or other appropriate members of the group described heretofore in connection with the organic binder, and mixtures of same, are suitable substances for use in the organic vehicle. The vehicle is incorporated in the paste in an amount suitable to impart the above-discussed desired rheology, generally in an amount up to 35to 40% by weight of the paste, sometimes as low as 15%, and occasionally even down to of from 5 to 10l %, by weight of the paste. The organic vehicle is such that it is substantially eliminated from the remaining components of the conductive paste by the conditions to which the paste is subjected during formation of the electroconductive body; thus, the organic vehicle is not present to any appreciable degree in an electroconductive body having a glassy matrix.

The conductive paste is made, for example, by combining silver-coated inorganic non-metallic particles, silver particles and an organic binder formable into a matrix, or silver-coated inorganic non-metallic particles, silver particles, particles of a glassy material and an organic vehicle. For example, the silver particles, in admixture with the organic binder or vehicle, can be wetted in a three-roll mill; then the silver-coated inorganic non-metallic particles can be incorporated and appropriately mixed into the system in a suitable apparatus, for example, a SPEX mixer or a common paint shaker. The resulting paste, as such, is then applied to a substrate, for example, a capacitor or a resistor or other dielectric component, etc., in connection with the fabrication of a further circuit component, or is packaged, and stored or shipped for subsequent use.

In accordance with this invention, an electroconductive body is fabricated from a conductive paste comprising silver-coated inorganic non-metallic particles, silver particles and organic binder by subjecting the paste to conditions sufficient to form the binder into a matrix in which the silver-coated inorganic non-metallic particles and particles of silver are embedded. During formation of the matrix, any solvent component present in the binder is for the most part, preferably completely, eliminated.

Typical techniques and conditions for forming the matrix from the organic binder are: air-drying of the paste at room or elevated temperature; heating of the paste up to a temperature of about 350° C. for a time sufficient for matrix formation, ultraviolet irradiation of the paste; catalyzed curing of the paste at a temperature within a range suitable for operation with the selected catalyst. Other commonly practiced methods for forming, for instance curing, the organic binder into a matrix are also suitable. The resultant matrix is an organic material produced by the action of the selected forming technique and/or conditions. Thus, the organic matrix is suitably a material formed from a resin or resins, as previously described, in the organic binder, such resin or resins being polymerized, cross-linked, or the like to make up the matrix. It will be understood that the technique and conditions selected for forming of the matrix are dependent on the type of organic binder employed and that such technique and conditions should cause formation of a suitable matrix without deforming the silver-coated inorganic non-metallic particles and silver particles, or otherwise altering the components of the system, so as to impede performance of the electroconductive body.

Alternatively, in accordance with this invention, an electroconductive body is fabricated from a conductive paste containing silver-coated inorganic non-metallic particles, silver particles, particles of glassy material and an organic vehicle by heating conductive paste of the invention up to a temperature, and for a time, sufficient to fuse the component particles of glassy material into a matrix in which the silver-coated inorganic non-metallic particles and particles of silver are embedded, and then cooling the fused body. Typically, the paste is heated up to a temperature in the range of from 450° to 900° C., for, say, about five minutes. If heating up is performed in an atmosphere containing oxygen, for example, ambient air, heat-up and cool-down rates are rapid, and illustratively about 130° C. per minute, in order to minimize, or prevent, oxidation of the component silver.

Since conductive paste of this invention is suitable for application to a substrate, such as a ceramic multilayer capacitor, it is within the scope of the invention to form an electroconductive body from the paste directly on a substrate to which the paste has been applied. For example, a paste is deposited on a substrate and suitabley air-dried, heated, irradiated, catalytically cured or fired along with the substrate to which it has been applied. It will be understood that conditions for forming the electroconductive body directly on the substrate are the same as those set forth previously for such formation, with the addtional consideration that forming techniques or conditions should not damage or deform the substrate, or, for that matter the silver-coated particles. Thus, the conductive paste of the invention is typically deposited on a capacitor as "termination paste" or sandwiched around a dielectric material and an electroconductive body formed to provide terminal or internal conductive members of various capacitor components. In this manner, conveniently sized and used capacitors, often termed "chips", are obtained for packaging for later use, for encapsulation in a hermetic package of glass (which, generally, itself requires firing) or an organic system, for dipping in solder to provide components which are readily integrated into circuits as desired, or for leading (usually by solder-dipping).

An electroconductive body in accordance with this invention comprises a matrix of organic material with silver-coated inorganic non-metallic particles and silver particles embedded therein. In an alternative embodiment an electroconductive body in accordance with this invention comprises a matrix of glassy material with silver-coated inorganic non-metallic particles and silver particles embedded therein. Typically, the glassy matrix is fused, that is to say, the product of fusion of particles of heat-fusible glassy material, as previously discussed. In both of these embodiments, the silver-coated inorganic non-metallic particles and silver particles are in effective contacting relationship to define one or more electroconductive paths through the matrix. For the purpose of this invention, "effective contacting relationship" means that silver-coated particles and silver particles adjacent one another are in direct intersurface contact, or close enough so that electrons can pass freely from one to the next. Effective contacting relationship is established between adjacent silver-coated particles, adjacent silver particles and/or a silver-coated particle and silver particle adjacent one another. This is illustrated in FIGS. 2 and 4.

The size of the silver-coated inorganic non-metallic particles and silver particles does not change appreciably, during the fabrication of the electroconductive body, from the size of these particles in the paste. Thus the silver-coated inorganic non-metallic particles are appropriately sized, as previously described, and typically are of a size from 1 to 100 microns in maximum dimension, on average. If silver-coated glass beads (or silver-coated spheres of other materials) are employed, they are typically of a size, on average, of up to 75 microns in diameter. Preferably, the coated beads are of a size, on average, of from 1 to 50, especially 1 to 30, microns in diameter. Further examples are coated beads of a size, on average, of from 1 to 5, from 5 to 10, from 10 to 15, and from 10 to 25 microns in diameter.

Similarly, the distribution and thickness of the silver layer on the inorganic non-metallic particles, as well as the amount of silver in the layer, is not appreciably altered in this fabrication.

Therefore, as previously indicated, the thickness of the silver layer on silver-coated inorganic non-metallic particles in the electroconductive body is preferably substantially uniform; but it is consistent with practicing of this invention that the thickness of the silver layer vary over particle surfaces, as long as conductivity of the electroconductive body is not appreciably impaired. Thickness is typically on the order of up to 10% of the maximum particle dimension, for instance of from 0.1 to 10% of the diameter of the bead.

Typically, at least 30 to 40% of the total weight of the electroconductive body is made up of silver-coated inorganic non-metallic particles, and the total amount of silver in the electroconductive body is suitably at least 10% by weight. In some embodiments it is desirably that the total amount of silver is at least 25%, and even at least 40%, be weight of the body. In a further embodiment of the invention, the electroconductive body contains silver-coated inorganic non-metallic particles whose silver coating constitutes up to 60%, for example of from 25 to 60%, by weight of the particles and coating. In some embodiments, the silver coating constitutes at least 25%, preferably at least 40%, by weight of the particle, for example a glass beaad, and coating. However, an electroconductive body incorporating silver-coated inorganic non-metallic particles wherein the silver constitutes less than 25%, illustratively of from 4 to 16%, by weight of the coated particle, is also suitable, and advantageous, for many applications, and is within the scope of this invention. Examples are electroconductive bodies containing silver-coated particles wherein silver constitutes 4%, 8%, 12% and 16%, respectively, by weight of the coated particle. In accordance with a preferred embodiment the foregoing applies to silver-coated glass beads. It is especially preferably that the total amount of silver which is incorporated into the electroconductive body be sufficient to prevent appreciable impairment of the properties of the body, such as conductivity and adhesion to a substrate, upon contact with solder.

It will be understood that the less the amount of silver contributed by the silver coatings of the inorganic non-metallic particles, the greater the amount of silver which is incorporated as silver particles, preferably flakes, to achieve the desired electrical and other properties. In this connection, particularly where the amount of silver in the coatings is relatively low the silver particles in the electroconductive body should constitute at least 5% by weight of the body; in some embodiments it is preferable that silver particles constitute at least 10%, and even at least 25%, by weight of the electroconductive body. However, it is generally preferred that as much of the silver as feasible be incorporated in the form of silver coating on inorganic non-metallic particles, so as to maximize the amount of silver available for conducting electrons in the body.

The total amount of silver present in the electroconductive body of this invention is selected based on the performance characteristics desired for the component in which the electroconductive body is to be used. Thus, the conductivity, adhesion to a selected substrate, solder-ability, solder-leaching resistance, dissipation factor and the like, which are required of the electroconductive body to perform compatibly with other materials, should be considered in selecting the total amount of silver. In general, all of the foregoing characteristics will be enhanced by increasing the total amount of silver in the electroconductive body. It will be understood that, even with increased silver content to enhance one or more properties of an electroconductive body, the electroconductive body of the claimed invention generally exhibits comparable or superior properties at lower cost than with a body in which the conductive component is solely silver particles.

Another factor to be taken into account in selecting materials for some embodiments of this invention is formation conditions, for instance firing range, which will be required of the conductive paste in connection with the fabrication of the electroconductive body. It is often the case that a relatively high firing temperature will be necessary, for instance, to effect adhesion of the electoconductive body to a substrate with which it is used. Generally, the temperature at which conductive paste can be fired is increased by employing an inorganic non-metallic particle comprising a more refractory material capable of withstanding higher temperatures, for example silica, feldspar or bauxite; increasing the particle size, for example of a spherical glass particle, such as a bead, and therefore of the silver-coated particle, also affords greater resistance to high firing temperatures.

It is a distinct advantage that conductive paste and electroconductive bodies of this invention comprise, in large part, silver-coated particles having cores of inorganic non-metallic material, which is, for example crystalline, such as rutile, or amorphous, such as glass. This is in direct contrast to those prior conductive pastes wherein silver, the conductive component, was present entirely in the form of solid particles. In such prior conductive pastes silver typiically was incorporated in amounts of from 60 to 85% by weight. Due to the incorporation of the above-mentioned inorganic non-metallic cores a significant amount of the volume previously occupied by silver is now taken up by much less expensive material, thereby affording a significant cost saving. Nevertheless, despite the substitution of inorganic non-metallic material for a significant amount of the silver employed in prior paste compositions, the conductivity of an electroconductive body made with the paste of the invention is at least as great as that of an electroconductive body containing 70% by weight silver, and made from a prior paste. Furthermore, this electroconductive body exhibits favorable electrical and other properties, such as conductivity, adhesion to a substrate and durability; and, in certain embodiments of the invention, these favorable properties are present despite contact of the body with solder. Additionally, the invention affords convenience and cost advantages since materials employable in the conductive paste, electroconductive body and silver-coated inorganic non-metallic particles, especially silver-coated glass beads, are easily obtainable and relatively inexpensive.

Thus, the objects of the invention are fulfilled in the provision of an electroconductive body exhibiting favorable performance characteristics, which is conveniently fabricated from available materials of comparatively low cost.

The terms and expressions which have been employed are used as terms of description and not of limitation, and there is no intention in the use of such terms and expressions of excluding any equivalents of the features shown and described or portions thereof, it being recognized that various modifications are possible within the scope of the invention.

What is claimed is:

1. A conductive paste suitable for forming an electroconductive body, which comprises inorganic non-metallic particles coated with silver, said silver-coated inorganic non-metallic particles being of a size, on average, of from 1 to 100 microns in maximum dimension, and silver particles, in an polymeric organic binder formable into a matrix having embedded therein said silver-coated inorganic non-metallic particles and silver particles, the total amount of silver in said paste constituting at least 10% by weight of the paste and the amount of silver in said silver particles constituting at least 5% by weight of the paste.

2. A conductive paste as defined in claim 1, wherein the organic binder comprises a resin.

3. A conductive paste as defined in claim 2, wherein the organic binder contains one or more solvents.

4. A conductive paste suitable for application to a substrate to form an electroconductive body thereon, which comprises inorganic non-metallic particles coated with silver, said silver-coated inorganic non-metallic particles being of a size, on average, of from 1 to 100 microns in maximum dimension, and silver particles, in an polymeric organic binder formable into a matrix having embedded therein said silver-coated inorganic non-metallic particles and silver particles, the total amount of silver in said paste being sufficient to prevent appreciable impairment of conductivity or adhesion to the substrate of said electroconductive body upon contact of the body with solder and said amount constituting at least 10% by weight of the paste, and the amount of silver in said silver particles constituting at least 5% by weight of the paste.

5. A conductive paste suitable for forming an electroconductive body, which comprises glass beads coated with silver, said silver-coated beads being of a size, on average, of from 1 to 50 microns in diameter, and silver particles, in a polymeric organic binder formable into a matrix having embedded therein said silver-coated beads and silver particles, the total amount of silver in said paste constituting at least 10% by weight of the paste and the amount of silver in said silver particles constituting at least 5% by weight of the paste.

6. A conductive paste as defined in claim 5, wherein said organic binder comprises an acrylic resin or an epoxy resin.

7. A conductive paste as defined in claim 5, wherein the silver coating of said silver-coated glass beads constitutes of from 4 to 16% by weight of the silver-coated beads.

8. A conductive paste suitable for forming an electroconductive body, which comprises glass beads coated with silver, said silver-coated glass beads being of a size, on average, of from 1 to 50 microns in diameter, and finely-sized silver flakes, in an polymeric organic resin binder formable into a matrix having embedded therein said silver-coated beads and silver flakes, the amount of silver in said silver flakes constituting at least 25% by weight of the paste, and the amount of silver on said silver-coated glass beads constituting from 4 to 16% by weight of the silver-coated beads, the total amount of silver in said paste being at least 10% by weight of the paste.

9. An electroconductive body, which comprises silver particles, and inorganic non-metallic particles coated with silver, said silver-coated inorganic non-metallic particles being of a size, on average, of from 1 to 100 microns in maximum dimension, said silver particles and silver-coated inorganic non-metallic particles being embedded in a matrix of non-conductive organic material, said silver-coated inorganic non-metallic particles and silver particles being in effective contacting relationship within said matrix, and the total amount of silver in said electroconductive body constituting at least 10% by weight of the body and the amount of silver in said silver particles constituting at least 5% by weight of the body.

10. An electroconductive body, which comprises silver particles, and inorganic non-metallic particles coated with silver, said silver-coated inorganic non-metallic particles being of a size, on average, of from 1 to 100 microns in maximum dimension, said silver particles and silver-coated inorganic non-metallic particles being embedded in a matrix of polymeric organic material, said silver particles and silver-coated inorganic non-metallic particles being in effective contacting relationship within said matrix, and the total amount of silver present in the electroconductive body being sufficient to prevent appreciable impairment of the body's conductivity and of its adhesion to a substrate upon contact of the body with solder and said amount constituting at least 10% by weight of the body, and the amount of silver in said silver particles constituting at least 5% by weight of the body.

11. An electroconductive body, which comprises glass beads coated with silver, said silver-coated glass beads being of a size, on average, of from 1 to 50 microns in diameter, and silver particles, both embedded in a matrix of polymeric organic material, said silver-coated glass beads and silver particles being in effective contacting relationship within said matrix, the total amount of silver in said electroconductive body constituting at least 10% by weight of the body and the amount of silver in said silver particles constituting at least 5% by weight of the body.

12. An electroconductive body as defined in claim 11, wherein the matrix comprises a resin.

13. An electroconductive body as defined in claim 11, wherein the silver particles are silver flakes.

14. An electroconductive body as defined in claim 11, wherein the organic material is an acrylic resin or an epoxy resin.

15. An electroconductive body as defined in claim 11, wherein the silver coating of said silver-coated glass beads constitutes of from 4 to 16% by weight of the silver-coated beads.

16. An electroconductive body, which comprises glass beads coated with silver, said silver-coated glass beads being of a size, on average, of from 1 to 50 microns in diameter, and silver particles, both embedded in a matrix of polymeric organic resin material, said silver-coated glass beads and silver particles being in effective contacting relationship within said matrix, the amount of silver in said silver particles constituting at least 25% by weight of the body.

* * * * *